United States Patent
Nakagawa et al.

(10) Patent No.: US 8,861,557 B2
(45) Date of Patent: Oct. 14, 2014

(54) WAVELENGTH-TUNABLE LIGHT SOURCE AND WAVELENGTH VARIATION METHOD

(71) Applicant: Fujitsu Limited, Kawasaki (JP)

(72) Inventors: Goji Nakagawa, Sagamihara (JP); Takeshi Hoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/966,833

(22) Filed: Aug. 14, 2013

(65) Prior Publication Data

US 2014/0098828 A1    Apr. 10, 2014

(30) Foreign Application Priority Data

Oct. 5, 2012   (JP) .................. 2012-223594

(51) Int. Cl.
| | |
|---|---|
| H01S 3/10 | (2006.01) |
| H01S 3/23 | (2006.01) |
| H01S 5/40 | (2006.01) |
| H01S 5/062 | (2006.01) |
| H01S 5/06 | (2006.01) |
| H04J 14/02 | (2006.01) |
| H01S 5/12 | (2006.01) |
| H01S 5/026 | (2006.01) |
| H01S 5/00 | (2006.01) |

(52) U.S. Cl.
CPC ............ *H01S 3/2391* (2013.01); *H01S 5/4031* (2013.01); *H01S 5/06213* (2013.01); *H01S 5/0612* (2013.01); *H01S 5/4087* (2013.01); H01S 5/12 (2013.01); *H01S 5/4012* (2013.01); H01S 5/026 (2013.01); H01S 5/005 (2013.01); *H04J 14/0265* (2013.01)
USPC ..... 372/20; 372/23; 372/50.121; 372/50.122; 372/50.11; 372/50.12

(58) Field of Classification Search
USPC ............... 372/20, 23, 50.121, 50.122, 50.12, 372/50.11
See application file for complete search history.

(56) References Cited

U.S. PATENT DOCUMENTS

| | | | |
|---|---|---|---|
| 5,612,968 | A | 3/1997 | Zah |
| 6,201,824 | B1 * | 3/2001 | Hong et al. ................. 372/50.11 |
| 7,112,827 | B2 * | 9/2006 | Hayakawa et al. ........... 257/116 |
| 2003/0002143 | A1 * | 1/2003 | Inoue et al. ................. 359/341.3 |
| 2006/0222039 | A1 * | 10/2006 | Yamazaki ....................... 372/94 |
| 2008/0267230 | A1 * | 10/2008 | Ducloux ......................... 372/20 |

FOREIGN PATENT DOCUMENTS

| | | |
|---|---|---|
| JP | 06-097884 | 4/1994 |
| JP | 2009-123985 | 6/2009 |
| JP | 2011-198903 | 10/2011 |

OTHER PUBLICATIONS

Extended European Search Report of European Patent Application 13181481.6 dated Feb. 4, 2014, 8 pages.

* cited by examiner

*Primary Examiner* — Kinam Park
(74) *Attorney, Agent, or Firm* — Fujitsu Patent Center

(57) ABSTRACT

A wavelength-tunable light source includes light sources having differing variable wavelength regions, where light sources having adjacent wavelength regions are distributed to different systems. The light sources are each set such that an end portion of the variable wavelength region of the light source overlaps an end portion of the variable wavelength region of another light source. A control unit selects and drives a first light source of a first system, varies a wavelength of the first light source, selects a second light source that is of a second system among the different systems and that has a wavelength region overlapping the variable wavelength region of the first light source, drives the second light source concurrently with the first light source and subsequently switches to the output light of the second light source, causing wavelength variation and executing continuous wavelength variation over a wide range.

12 Claims, 11 Drawing Sheets

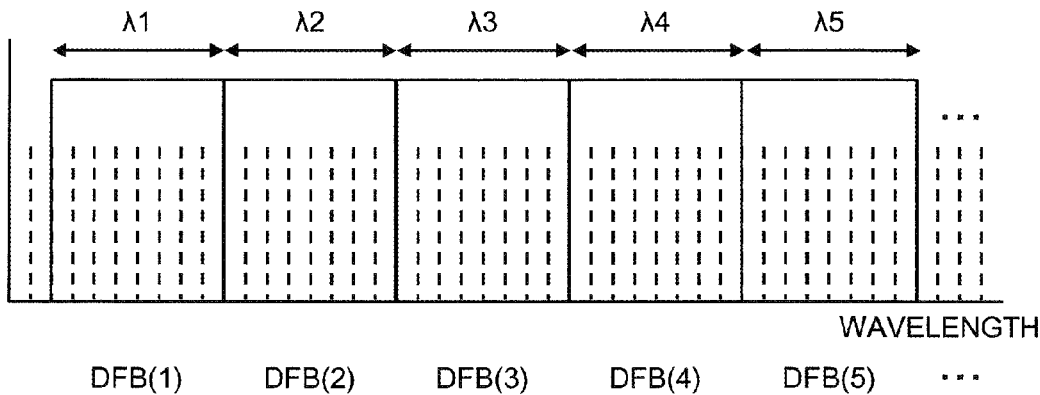
FIG.3A CONVENTIONAL
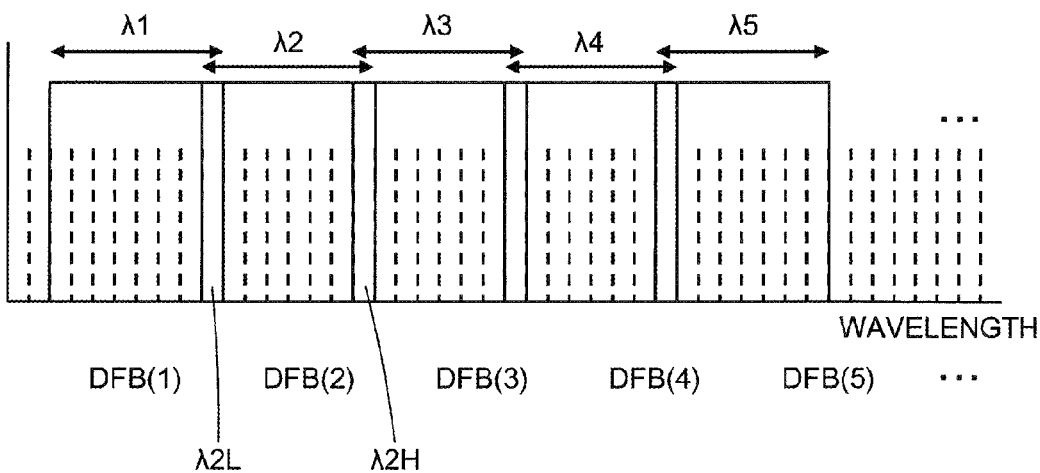
FIG.3B EMBODIMENT
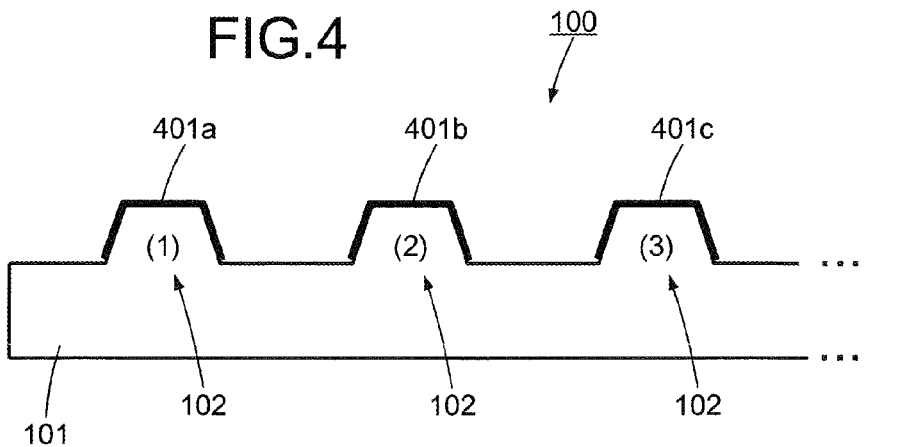
FIG.4

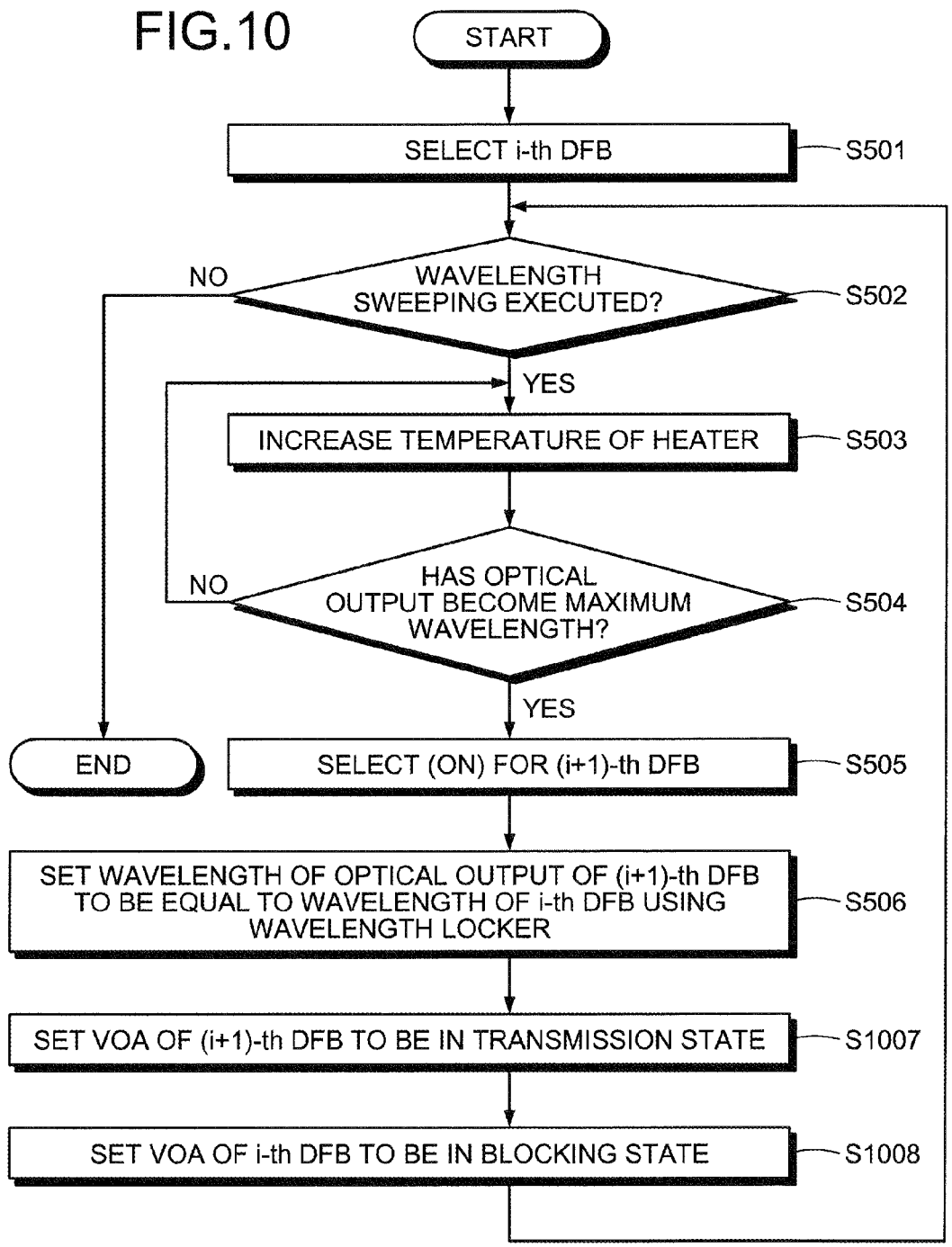

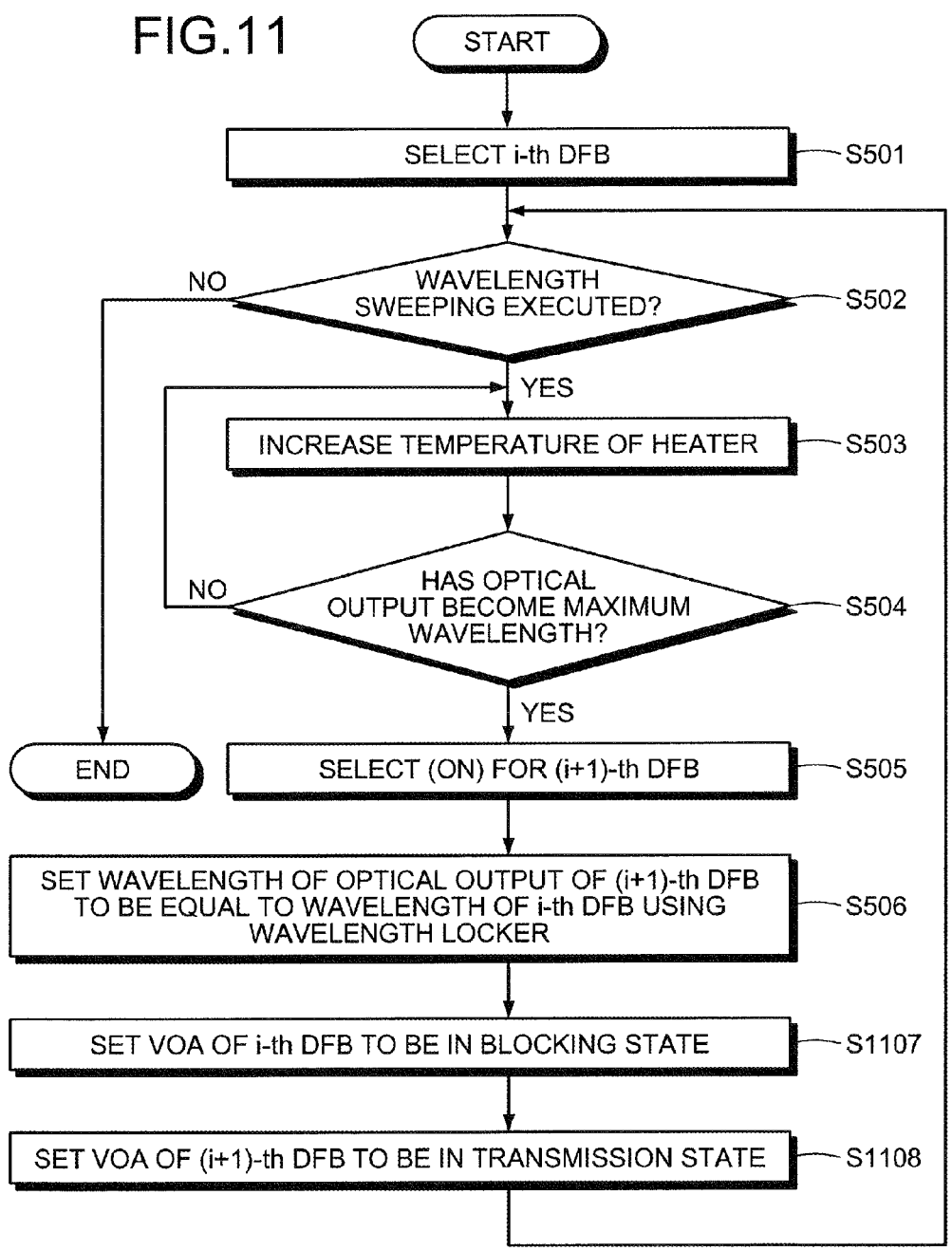

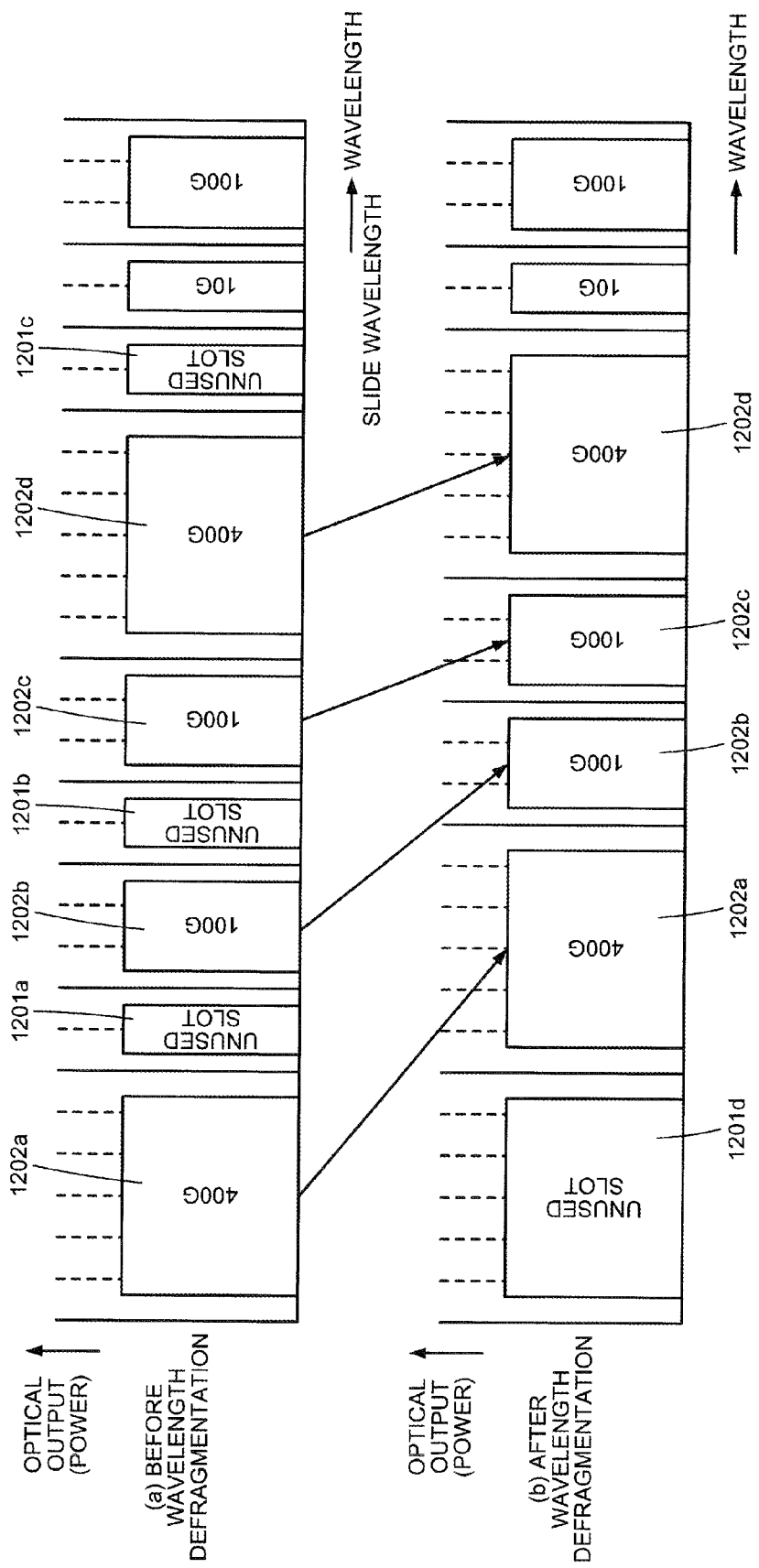

WAVELENGTH-TUNABLE LIGHT SOURCE AND WAVELENGTH VARIATION METHOD

CROSS REFERENCE TO RELATED APPLICATIONS

This application is based upon and claims the benefit of priority of the prior Japanese Patent Application No. 2012-223594, filed on Oct. 5, 2012, the entire contents of which are incorporated herein by reference.

FIELD

The embodiments discussed herein are related to a wavelength-tunable light source and a wavelength variation method that can cause the wavelength to continuously vary over a wide range.

BACKGROUND

For next-generation optical communication, a reconfigurable optical add/drop multiplexer (ROADM) network has been proposed. Demands of the ROADM include flexible coping of dynamic traffic variation, unexpected updating of the network configuration, etc. Optical paths differing signal bit rates and differing modulation formats, each of which differ depending on the required transmission capacity and the transmission distance. Thus, the spectrum bands used by the optical paths differ from each other.

Consequently, optical communication systems have started to employ a flexible grid dense wavelength division multiplexing (DWDM) scheme instead of a conventional fixed grid wavelength division multiplexing scheme.

Distributed feedback (DFB) array wavelength-tunable lasers are present as wavelength-tunable light sources that can arbitrarily vary the wavelength output and that are employed in optical communication systems. The DFB array includes, for example, a laser array unit, an optical coupling unit, and a semiconductor optical amplifier (SOA) (see, e.g., Japanese Laid-Open Patent Publication No. 2011-198903). The DFB array wavelength-tunable light sources do not cause mode hopping (discreteness of the frequencies) that a device employing an outer oscillator (a diffraction grating) causes, and can narrow the linewidth. Therefore, the light source is suitable as a coherent light source, and the size and the cost thereof can be reduced.

The DFB lasers integrated in an array form, e.g., 12-DFB laser array, are designed such that adjacent lasers have oscillation wavelengths that differ from each other by 3.2 nm. A laser is operated, whereby the oscillation wavelength is roughly selected. The temperature of the selected laser chip is varied, whereby the oscillation wavelength is adjusted. For an ordinary DFB laser array, a Peltier cooler, etc. is disposed immediately beneath the integrated DFB array element and thereby, adjusts the temperature of the entire DFB array. With this configuration, for example, a band of 4.8 THz (=12×400 GHz) can be varied that is formed by 80 wavelengths in C band at 50-GHz intervals.

However, for the DFB laser array, for example, concerning the variation of the wavelength of only one of the 12 lasers, the wavelength of the laser can be caused to continuously vary by causing the temperature to continuously vary. However, to increase the range of the variation of the wavelength, another (an adjacent) laser has to be selected and the laser in operation has to be switched. Consequently, when the laser is switched, the output of the light becomes discontinuous and smooth variation of the continuous wavelength can not be achieved for a range that exceeds the range within which the wavelength can be varied by the temperature variation of one laser device.

With the above flexible grid scheme, unusable fragmentary spectrum bands appear in the used band (such as C band) after the optical path is repeatedly changed. Thus, a problem arises in that the efficiency of spectrum band use drops. To cope with this, wavelength defragmentation is proposed in which unused spectrum bands are filled by gradually varying the wavelength while maintaining the connection of the optical path that is currently in operation. However, with the DFB laser array, smooth variation of the continuous wavelength can not be achieved and the optical output is discontinuous and therefore, wavelength defragmentation can not be executed and no improvement of the efficiency of wavelength use can be facilitated.

SUMMARY

According to an aspect of an embodiment, a wavelength-tunable light source includes light sources having differing variable wavelength regions, where light sources having adjacent wavelength regions are distributed to different systems; a first coupling device that couples light output by the light sources included in the same system; an optical switching device that transmits or blocks light included in the same system; a second coupling device that couples light of the different systems and outputs the coupled light; and a control unit that controls driving of each of the light sources and the optical switching device. The light sources are each set such that an end portion of the variable wavelength region of the light source overlaps an end portion of the variable wavelength region of another light source. The control unit selects and drives a first light source among the light sources of a first system that is among the different systems, varies a wavelength of the first light source. The control unit further selects a second light source that is of a second system among the different systems and that has a wavelength region overlapping the variable wavelength region of the first light source. The control unit further drives the second light source concurrently with the first light source and subsequently switches to the output light of the second light source, causing wavelength variation and executing continuous wavelength variation over a wide range.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A and 3B are charts of setting states of adjacent wavelength regions of a DFB laser array;

FIG. 4 is a cross-sectional diagram of heaters that are disposed on the DFB laser array;

FIG. 10 is a flowchart of an example of the control of the variation of the wavelength according to the third embodiment;

FIG. 11 is a flowchart of another example of the control of the variation of the wavelength according to the third embodiment; and FIG. 12 is a chart of an example where the variation of the wavelength executed by the wavelength-tunable light source is applied to wavelength defragmentation.

DESCRIPTION OF EMBODIMENTS

Figure 1:
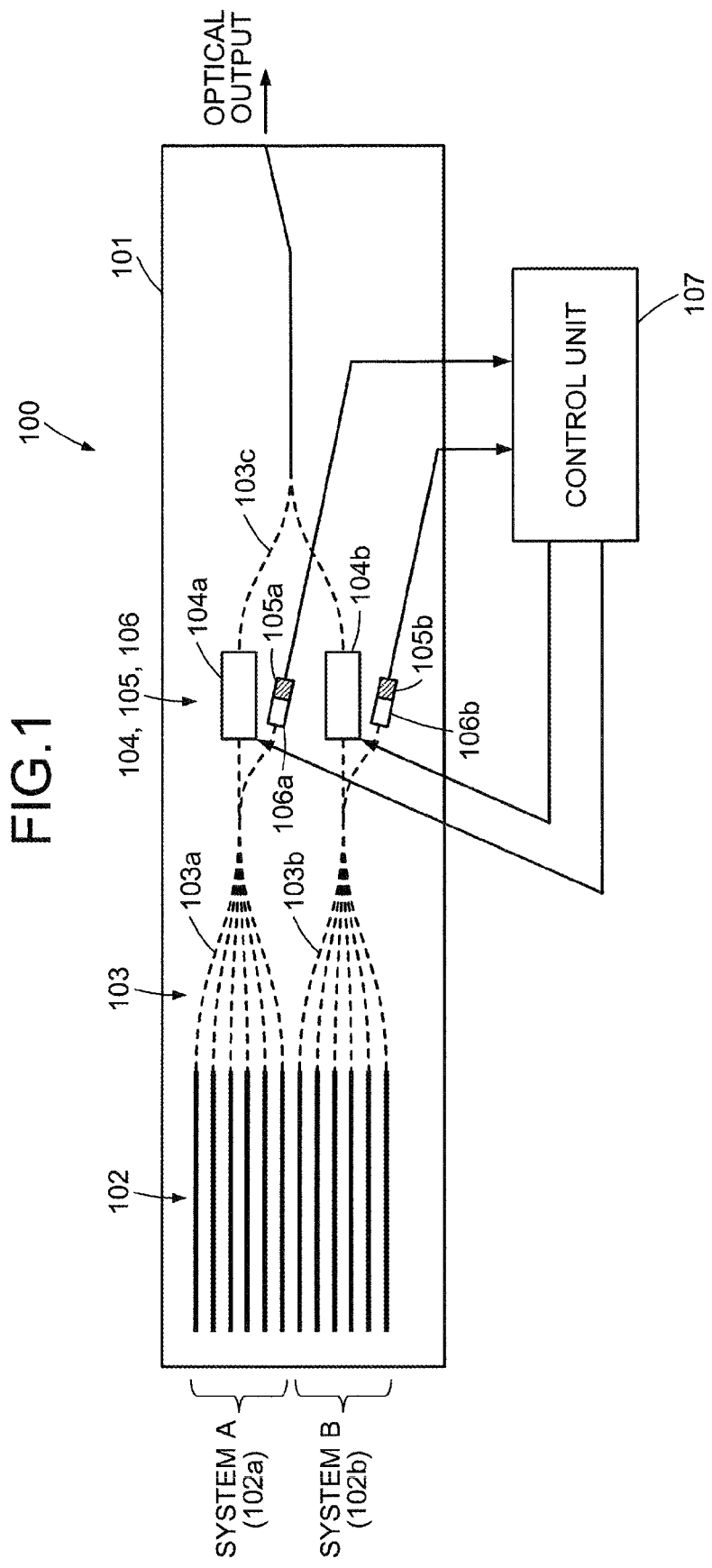
FIG. 1 is a diagram of a wavelength-tunable light source according to a first embodiment.

Preferred embodiments will be described with reference to the accompanying drawings. FIG. 1 is a diagram of a wavelength-tunable light source according to a first embodiment. FIG. 1 depicts a plan view of a DFB array-type wavelength-tunable light source 100. The wavelength-tunable light source 100 includes a DFB laser array 102 as a light source disposed on a substrate 101, an optical coupler 103, optical switching devices 104, a photo detector 105, a wavelength locker 106, and a control unit 107. Although not depicted, a temperature adjusting element such as a Peltier cooler is disposed immediately beneath the integrated DFB array element on the substrate 101 as described above and adjusts the temperature of the entire wavelength-tunable light source 100.

The DFB laser array 102 is an array of laser devices disposed in parallel on the substrate 101. For example, 12 laser devices are disposed in parallel, in an array, and are divided into two systems. As depicted in FIG. 1, the upper half portion including six laser devices are provided as a system "A" (102a) and the lower half portion also including six laser devices are provided as a system "B" (102b). Each of the laser devices can reduce the linewidth by being used as a long resonator having a predetermined length on the substrate 101, and is suitable as a coherent light source.

The laser devices have oscillation wavelengths (central wavelengths) that differ from one another. For example, the 12-DFB laser array 102 is designed such that adjacent laser devices thereof have oscillation wavelengths that differ from one another by 3.2 nm. Each of the oscillation wavelengths can be varied by controlling the temperature of the corresponding laser device. Thereby, the DFB laser array 102 can vary the band of the optical output in the wavelength range of 4.8 THz (=12×400 GHz), which is 80 wavelengths in the C band at 50-GHz intervals.

The optical coupler 103 includes an optical coupler 103a that couples the optical output of the system A (102a); an optical coupler 103b that couples the optical output of the system B (102b); and an optical coupler 103c that is disposed downstream from the optical switching devices 104, that couples the optical output of the systems A and B, and that outputs the coupled output to an external destination. The optical coupler 103, for example, performs optical coupling using waveguides disposed on the substrate 101.

The optical switching devices 104 are disposed for the systems A and B, are synchronized with each other, and switch the optical output to either that from the optical switching device 104a of the system A or that from the optical switching device 104b of the system B, under the control of the control unit 107. For example, a variable optical attenuator (VOA) or a semiconductor optical amplifier (SOA) that can switch between the transmission and blocking of optical output (for example, can cause the attenuation level of the optical output to continuously vary) can be used as the respective optical switching devices 104.

The photo detector 105 includes a photo detector 105a that detects the optical output (power) of the system A and a photo detector 105b that detects the optical output (power) of the system B. The wavelength locker 106 includes a wavelength locker 106a that detects the optical wavelength of the system A and a wavelength locker 106b that detects the optical wavelength of the system B. As to the photo detector 105 and the wavelength locker 106, those integrated into one component are also applicable. For example, the photo detector 105a and the wavelength locker 106a for the system A may be integrated into one component and, the photo detector 105b and the wavelength locker 106b for the system B may be integrated into one component. The photo detectors 105 (105a and 105b) and the wavelength lockers 106 (106a and 106b) branch a portion of the light input into the optical switching device 104, detect the optical output and the wavelength thereof, and output a detection signal to the control unit 107.

The control unit 107 selects and drives one of the laser devices that corresponds to a requested optical wavelength, causing the selected laser device to output light. The control unit 107 controls the optical output and the optical wavelength of the selected array, based on the detection signal of the photo detector 105 and the wavelength locker 106. When the control unit 107 causes the band of the optical output to vary (wavelength sweeping), the control unit 107 selects one laser device after another that respectively correspond to the wavelength to be swept of the DFB laser array 102 and executes the wavelength variation control for the selected laser device. When the band to be varied exceeds the range of the wavelength that can be varied by one laser device, the control unit 107 executes control to use a different laser device and thereby, sequentially switch the optical output. In this case, while a given laser device is in operation, the control unit 107 temporarily sets the wavelength of the optical output of another laser device to be equal to the wavelength of the given laser device and switches operation to the other laser device.

The control unit 107 can be configured by a processor such as a CPU, and hardware including memory, etc. that stores a control program of processes for the CPU to execute. Alternatively, the control unit 107 can be configured by a specific hardware circuit.

Figure 2:
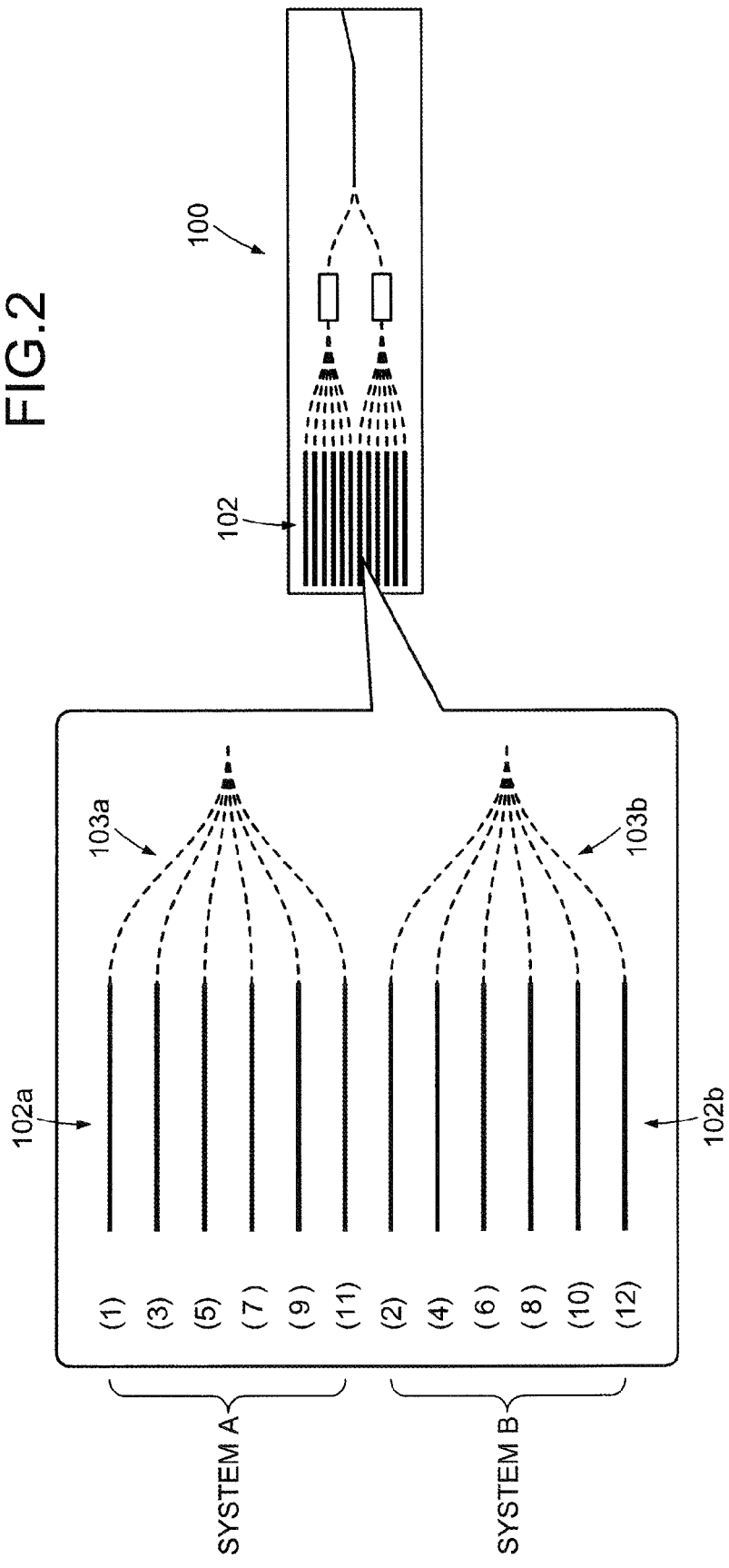
FIG. 2 is an enlarged partial diagram of DFB laser array systems.

FIG. 2 is an enlarged partial diagram of the DFB laser array systems. As depicted in FIG. 2, the DFB laser array 102 include laser devices of adjacent wavelength regions, among which odd-numbered laser devices are included in the system A (102a) and the even-numbered laser devices are included in the system B (102b). In a predetermined band variation region (for example, C band), the wavelength regions of the laser devices are alternately distributed to and are alternately disposed in the systems A and B (102a and 102b).

In other words, the laser device with the number (1) in the system A (102a) is set to have the lowest wavelength region; the laser device with the number (2) in the system B (102b) is set to have the wavelength region next to the wavelength region of the laser device with the number (1); and the laser device with the number (3) in the system A (102a) is set to have the wavelength region next to the wavelength region of the laser device with the number (2). In this manner, the wavelength regions in the band variation region are respectively distributed to the different systems A and B in an alternating manner. During the wavelength sweeping, the system A (102a) is selected in the odd-numbered selection sessions and the system B (102b) is selected in the even-numbered selection sessions.

As described, the systems A and B (102a and 102b) can be separated from each other and thereby, laser devices having adjacent wavelength regions can be disposed at positions that are physically away from one another. To maximally separate the wavelength regions whose laser numbers are adjacent to one another (for example, the numbers (1) and (2), and the numbers (2) and (3)) from one another in the case of N (N is an even number) laser devices, the laser devices merely have to be disposed in the order of 1, N/2+1, 2, N/2+2, ..., N (the state of FIG. 2).

Thus, when the wavelength sweeping is executed, the sequentially selected laser devices having adjacent wavelength regions are not physically adjacent to each other and are disposed at a distance from one another. Therefore, when the wavelength sweeping is executed for adjacent wavelength regions, the laser device that is to operate next is not affected by the heat of the laser device currently under operation and the laser devices having the adjacent wavelength regions can be thermally controlled. Because the systems A and B are at a distance from one another, the influence of the electrical cross-talk can be reduced and thermal leakage can also be reduced between the systems A and B. Therefore, thermal control (the wavelength control) can stably be executed.

FIGS. 3A and 3B are charts of the setting states of the adjacent wavelength regions of the DFB laser array. FIG. 3A depicts a conventional wavelength setting state and FIG. 3B depicts the wavelength setting state of the embodiment. In the charts, the vertical axis represents the optical output (power). As depicted in FIG. 3A, typically, for the DFB laser array, wavelength regions $\lambda 1, \lambda 2, \ldots, N$ are respectively partitioned for the laser devices (1), (2), ..., (N).

In contrast, as depicted in FIG. 3B, for the DFB laser array 102 of the embodiment, the end (a wavelength) of the wavelength region of each of the laser devices is set to overlap the end (a wavelength) of the wavelength region of another laser device. As depicted in FIG. 3B, taking the laser device (2) as an example, a portion (the end) $\lambda 2L$ on the lower wavelength side of the wavelength region overlaps the higher wavelength side (the end) of the laser device (1). A portion (the end) $\lambda 2H$ on the higher wavelength side of the wavelength region is set to overlap the lower wavelength side (the end) of the laser device (3). For example, each of these overlapping wavelength regions is set to be a region equal to or larger than one DWDM grid. Thus, in each of the overlapping wavelength regions $\lambda 2L$ and $\lambda 2H$, the two laser devices corresponding to the two sequential wavelength regions, concurrently have the same wavelength and can concurrently be operated (can output light). As described with reference to FIG. 2, the adjacent laser devices (1) and (2) belong to systems that are different from one another and are disposed a distance from one another.

FIG. 4 is a cross-sectional diagram of heaters that are disposed on the DFB laser array. In the cross section, the laser devices (1), (2), ..., (N) of the DFB laser array 102 include optical waveguides on the substrate 101. The laser devices (1), (2), ..., (N) are respectively provided with heaters 401 (401a, 401b, ..., 401n) along the surfaces of the optical waveguides. For example, a metal film such as titanium (Ti), platinum (Pt), chromium (Cr), or nickel (Ni) is used in the heaters 401 and the heaters 401 can control heating by controlling an electrical current. Thus, the heaters 401 respectively disposed for the laser devices (1), (2), ..., (N) of the DFB laser array 102 respectively adjust the temperature, and the wavelength can be varied for each of the laser devices consequent to the temperature adjustment. The variation of the wavelength of each of the laser devices, based on the temperature adjustment, is controlled by the control unit 107.

Figure 5:
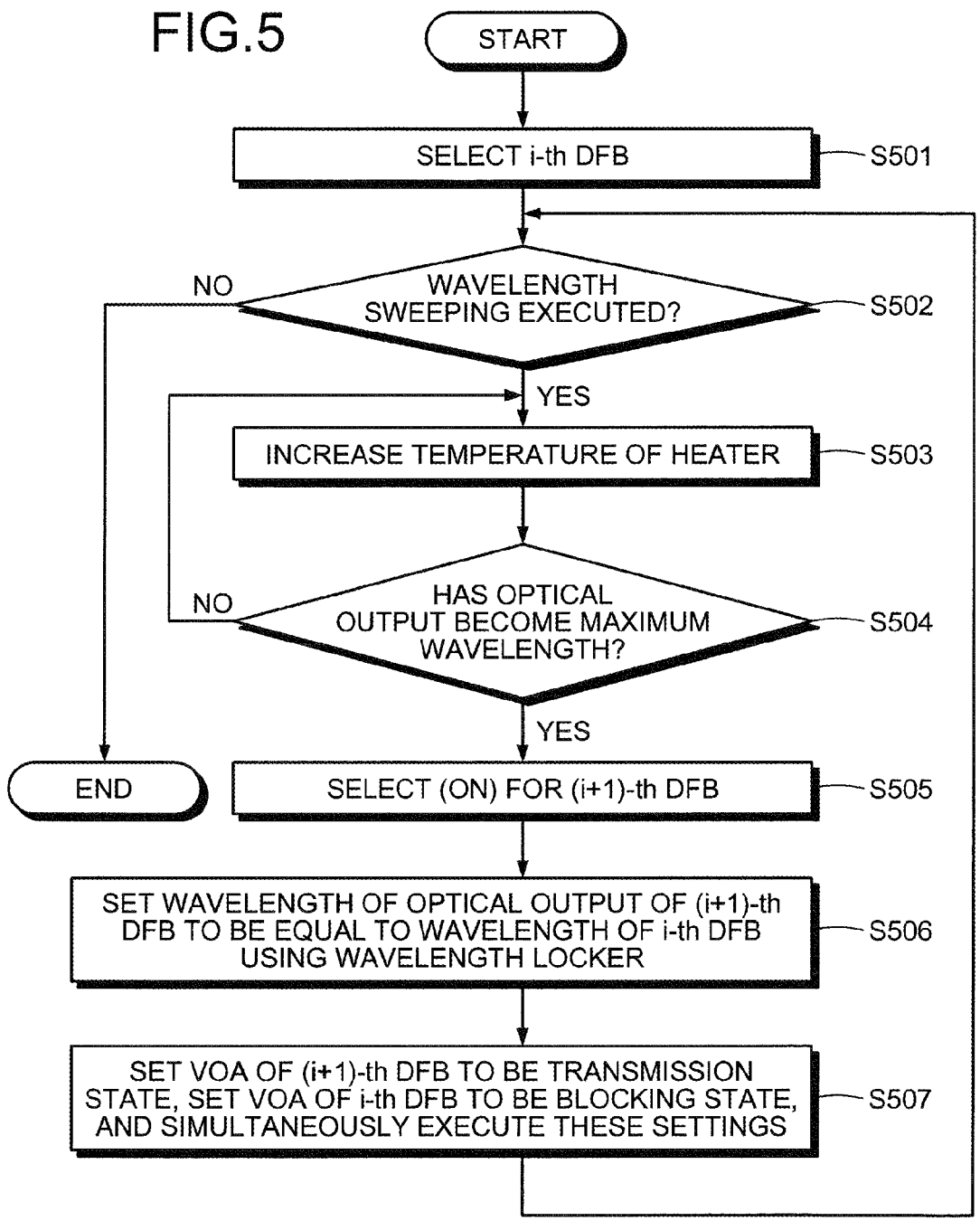
FIG. 5 is a flowchart of an example of control of wavelength variation according to the first embodiment.

FIG. 5 is a flowchart of an example of the control of wavelength variation according to the first embodiment, and depicts the content of the control executed by the control unit 107. The description below will be made taking an example where a variable optical attenuator (VOA) is used as the optical switching device 104.

The control unit 107 first selects an i-th (i=1 to N) DFB (laser device) of the DFB laser array 102 (step S501). In the example, the i-th DFB (laser device) belongs to the system A and (i+1)-th DFB (laser device) belongs to the system B.

In this state, for the selected i-th laser device, the wavelength locker 106a detects the wavelength thereof and the control unit 107 performs control to lock the wavelength such that the detected wavelength is a predetermined wavelength (for example, the central wavelength of the laser device). The photo detector 105a detects the optical output and the control unit 107 controls the amount of attenuation of a VOA 1 (104a) to set the optical output to be constant. Here, the VOA 1 (104a) of the system A is in a state where the optical output is transmitted and a VOA 2 (104b) of the system B is in a state where the optical output is blocked.

For the optical output of the wavelength-tunable light source 100, if the wavelength sweeping is not executed (including the time when the sweeping is completed up to the upper limit wavelength) (step S502: NO), the process comes to an end. However, if the wavelength sweeping is executed (step S502: YES), the control unit 107 executes the following operations.

The control unit 107 increases the temperature of the heater 401 of the i-th DFB (laser device) selected at step S501 (step S503). Thereby, the wavelength of the optical output of the i-th DFB (laser device) is increased and the control unit 107 determines whether the wavelength of the optical output of the i-th DFB (laser device) has become the maximum wavelength (step S504). Until the time when the wavelength of the optical output of the i-th DFB (laser device) becomes the maximum wavelength (step S504: NO), the control unit 107 continues to increase the temperature of the heater 401.

When the wavelength of the optical output of the i-th DFB (laser device) is the maximum wavelength (step S504: YES), the control unit 107 further selects (ON) for the (i+1)-th DFB (laser device) (step S505). When the control unit 107 selects the (i+1)-th DFB (laser device) of the system B, the VOA 2 (104b) of the system B is set to be in the blocking state.

The control unit 107 sets the wavelength of the optical output of the selected (i+1)-th DFB (laser device) of the system B to be equal to the wavelength of the i-th DFB (laser device) of the system A using the wavelength locker 106b (step S506). The temperature of the (i+1)-th DFB (laser device) of the system B is low immediately after the DFB (laser device) is selected at step S505 and therefore, the control unit 107 controls the temperature of the heater 401 to increase the temperature such that the wavelength of the (i+1)-th DFB (laser device) becomes equal to the wavelength of the i-th DFB (laser device). As described, the DFB laser arrays 102 are set such that the wavelength region of the i-th laser device and the wavelength region of the (i+1)-th laser device that is adjacent thereto partially overlap. Therefore, the wavelength of the (i+1)-th DFB (laser device) and the wavelength of the i-th DFB (laser device) can be set to be equal to each other.

The control unit 107 sets the state of the VOA 2 (104b) of the (i+1)-th DFB (laser device) to be the transmission state, further sets the state of the VOA 1 (104a) of the i-th DFB (laser device) to be the blocking state, and simultaneously executes these settings (step S507). The control unit 107 switches the optical output of the wavelength-tunable light source 100 from the optical output of the DFB (laser device) of the system A to that of the DFB (laser device) of the system B.

The flow returns to step S502 and the operations at step S502 and thereafter are executed. Thus, the wavelength-tunable light source 100 sequentially switches between the systems A and B of the plural DFBs (laser devices).

Figure 6:
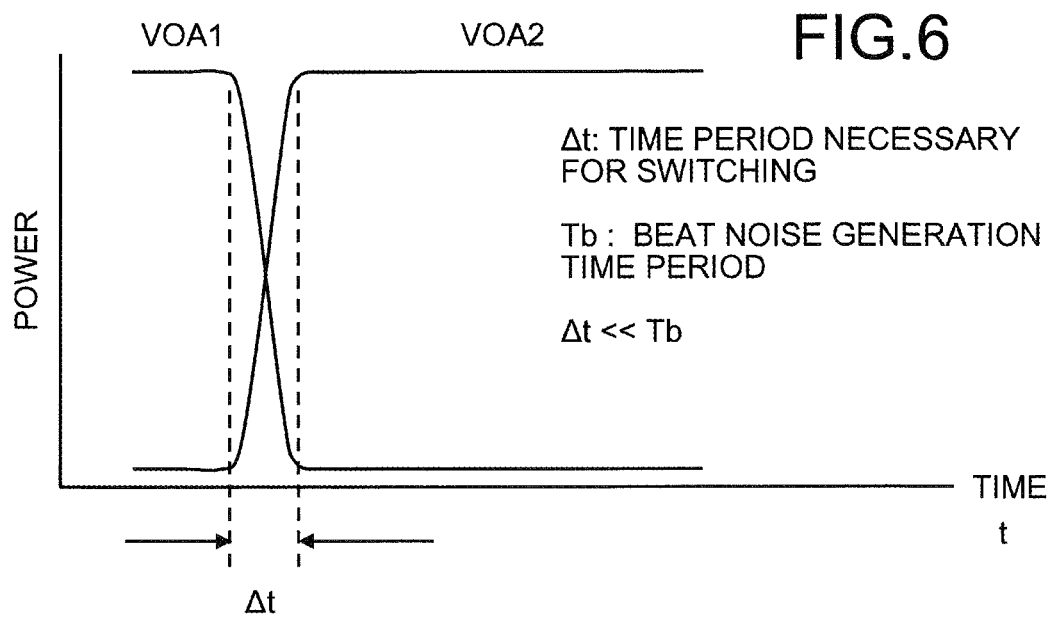
FIG. 6 is a chart of a timing of optical output switching between systems.

FIG. 6 is a chart of the timing of optical output switching between the systems. In FIG. 6, the horizontal axis represents time and the vertical axis represents the optical output (power). The time period Δt necessary for the switching between the VOA 1 (104a) of the system A and the VOA 2 (104b) of the system B is a time period that is shorter than the beat noise generation time period Tb that is, for example, about a sub-nano second and the switching is executed during such a time period.

For example, when the optical output of the wavelength-tunable light source 100 is switched from that of the system A to that of the system B, as depicted in FIG. 6, for the system A, the amount of attenuation of the VOA 1 (104a) is increased and thereby, the optical output is reduced (the falling edge of the optical output "transmission to blocking"). Concurrently, for the system B, the amount of attenuation of the VOA 2 (104b) is reduced and thereby, the optical output is increased (the rising edge of the optical output "blocking to transmission"). Thus, the switching between the systems A and B can be executed while maintaining the optical output (power) to be constant.

In this switching, even when the systems A and B are caused to output light of the same wavelength, a frequency difference (a wavelength difference) of several MHz to several GHz occurs in the central wavelength between the systems A and B due to the linewidth, an error in the setting, etc. When the waves of the optical output of the systems A and B are coupled with each other, beat noise corresponding to the frequency difference is generated at a predetermined cycle and consequently, the quality of the coupled optical output drops. The time period Δt necessary for the switching of the optical output between the systems A and B corresponds to the rising time period or the falling time period of the optical signal of each of the systems A and B. With Δt, the systems A and B are switched therebetween in a time period that is sufficiently shorter than the generation cycle of the beat noise. Thereby, the beat noise that is included in the component of the optical output of the wavelength-tunable light source 100 when the systems are switched, can be reduced.

In the description, a variable optical attenuator (VOA) is used as the optical switching device 104. However, the switching between the systems A and B can be executed similarly to that executed by the VOA by using a semiconductor optical amplifier (SOA) and causing the SOA to vary the state of the optical amplification (decrease or increase gain).

According to the first embodiment, the band of the optical output can be caused to continuously vary over a wide range (for example, the entire C band) of wavelength exceeding the wavelength region of one DFB (laser device), by using the DFB laser devices. Therefore, in the embodiment, the band is varied by switching the DFB (laser device) that is to be operated in the DFB laser array. However, during the switching, the wavelengths of the output of the two laser devices are set to be equivalent and as a result, the optical output does not become discontinuous. The switching is executed and consumes a time period that is shorter than the generation period of beat noise that is caused by the coupled waves of the two laser devices. Therefore, the effects of the beat noise can also be eliminated. The use of the DFB laser array can implement a simple configuration and can facilitate reductions in size and cost. Even when the wavelength is varied, coherent-light communication can be continued.

Figure 7:
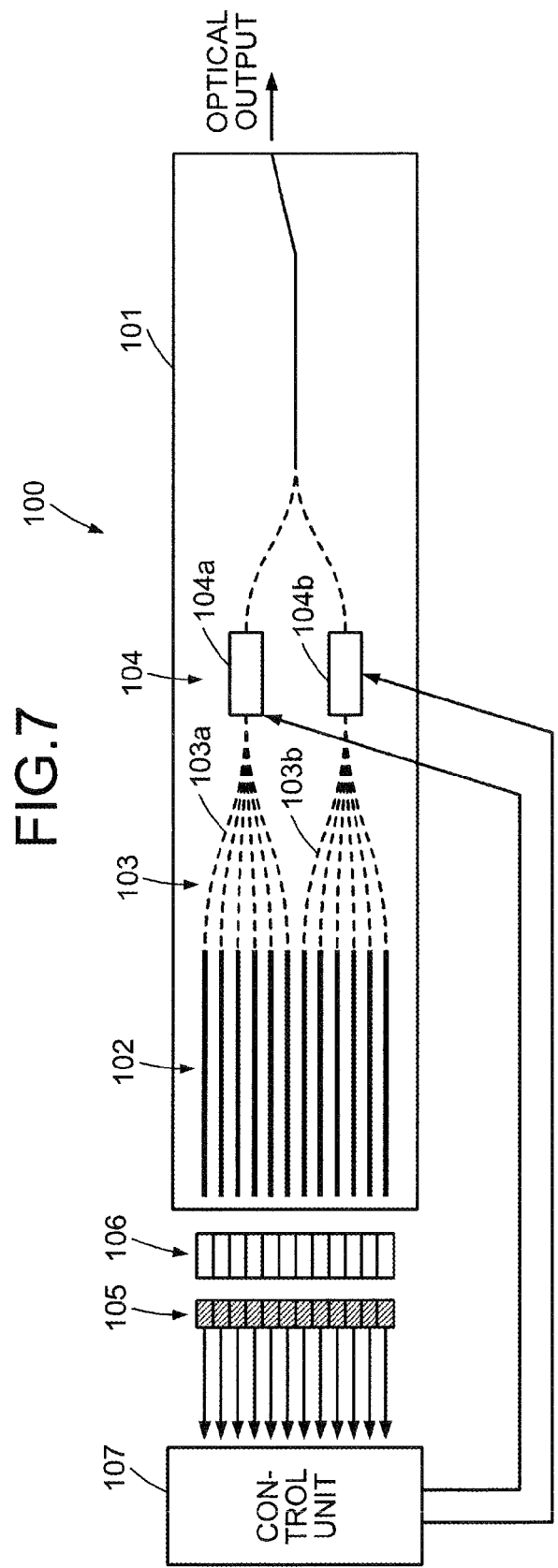
FIG. 7 is a perspective view of the wavelength-tunable light source according a second embodiment.

FIG. 7 is a perspective view of the wavelength-tunable light source according a second embodiment. The second embodiment has a configuration in which the positions of the photo detector (PD) 105 and the wavelength locker 106 differ from those in the first embodiment. As depicted in FIG. 7, the photo detector (PD) 105 and the wavelength locker 106 respectively disposed for each of the laser devices (12) in the DFB laser array 102, and are disposed in a direction reverse to the direction of the optical output of the DFB laser array 102 (upstream from the DFB laser array 102).

The photo detector 105 and the wavelength locker 106 detect the optical output (power) and the wavelength of each of the laser devices of the DFB laser array 102 and outputs the detected optical power and the wavelength to the control unit 107. As described above, the configuration can also be adapted to detect the optical output and the wavelength for each laser device of the DFB laser array 102 and therefore, the same operational effect can be achieved as that of the first embodiment.

Figure 8:
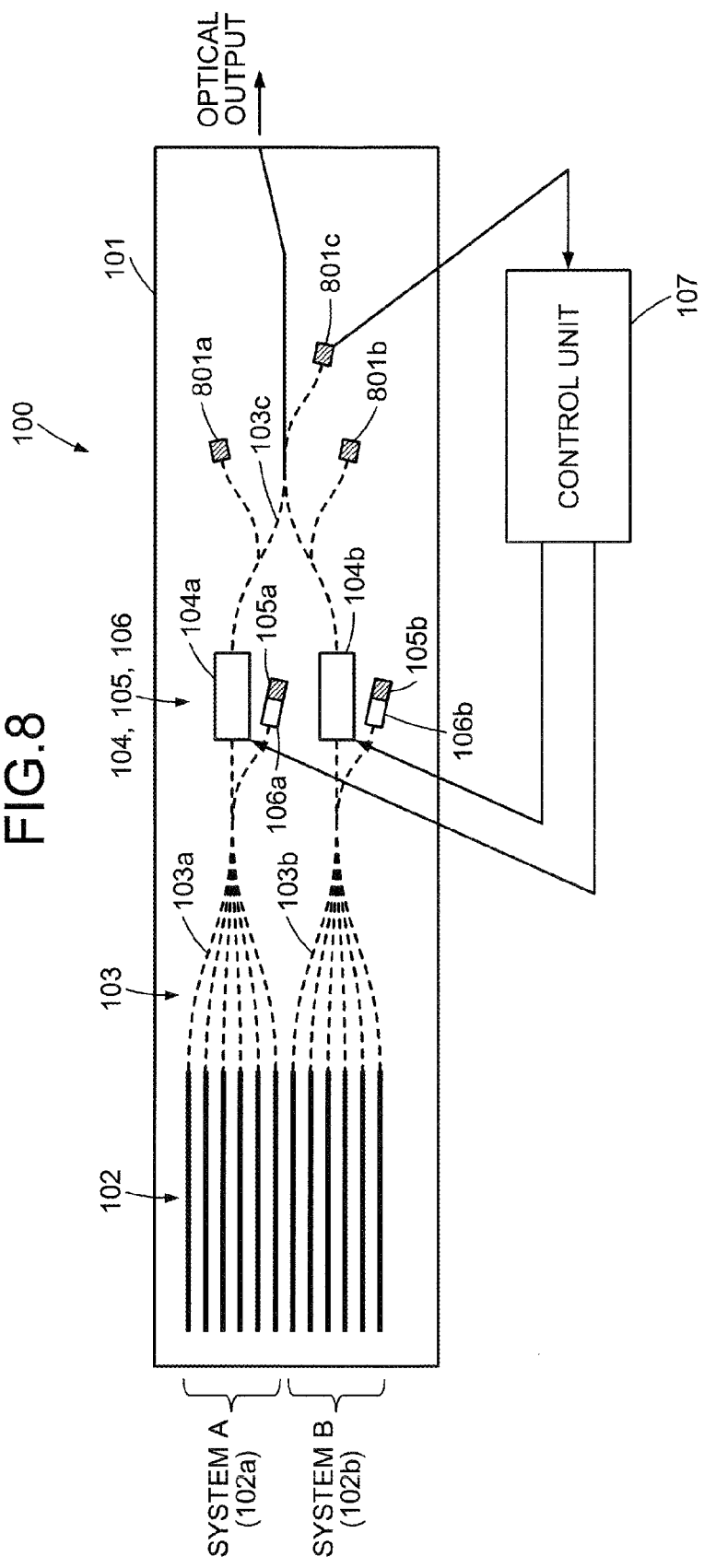
FIG. 8 is a perspective view of the wavelength-tunable light source according to a third embodiment.

FIG. 8 is a perspective view of the wavelength-tunable light source according to a third embodiment. In FIG. 8, components identical to those of the first embodiment (FIG. 1) are given the same reference numerals used in the first embodiment and will not again be described. In the wavelength-tunable light source 100 of the third embodiment, a photo detector (PD 1) 801a is disposed downstream from the optical switching device 104a of the system A and a photo detector (PD 2) 801b is disposed downstream from the optical switching device 104b of the system B. A photo detector (PD 3) 801c is disposed downstream from the optical coupler 103c that couples the waves of the optical signals of the systems A and B.

Figure 9:
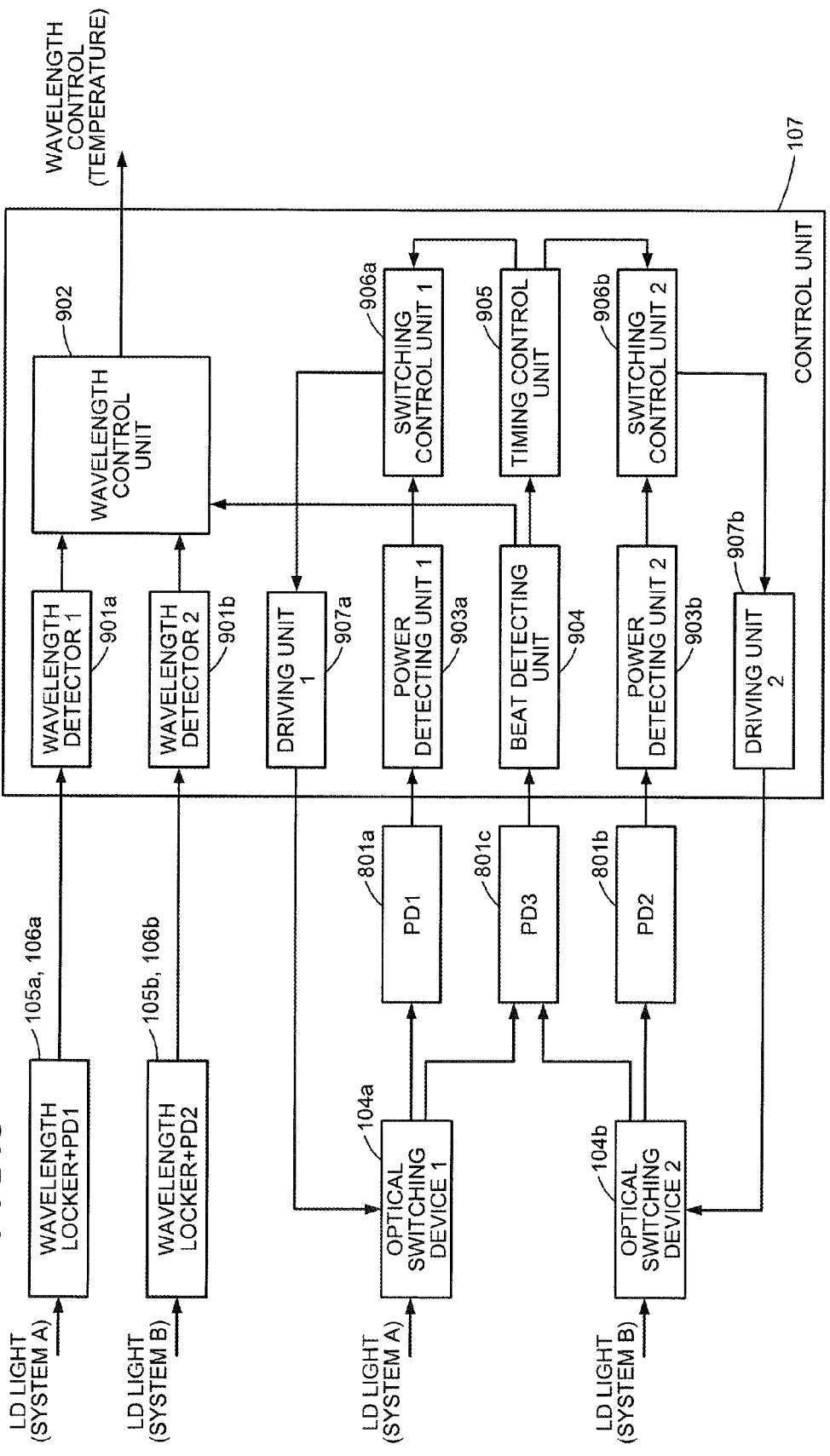
FIG. 9 is a block diagram of an internal configuration of a control unit according to the third embodiment.

FIG. 9 is a block diagram of an internal configuration of a control unit according to the third embodiment and depicts the internal configuration of the control unit 107 depicted in FIG. 8. The control unit 107 includes wavelength detecting units 1 and 2 (901a and 901b), a wavelength control unit 902, power detecting units 1 and 2 (903a and 903b), a beat detecting unit 904, a timing control unit 905, switching control units 1 and 2 (906a and 906b), and driving units 1 and 2 (907a and 907b).

The wavelength detecting unit 1 (901a) receives input of the detection signals of the wavelength locker 106a and the photo detector (PD 1) 105a of the system A, detects the wavelength of the optical output of the system A, and outputs the detection signal to the wavelength control unit 902. The wavelength detecting unit 2 (901b) receives input of the detection signals of the wavelength locker 106b and the photo detector (PD 2) 105b of the system B, detects the wavelength of the optical output of the system B, and outputs the detection signal to the wavelength control unit 902.

The power detecting unit 1 (903a) receives input of the detection signal of the photo detector 1 (PD 1) 801a, detects the optical output (power) obtained after passing through the optical switching device 1 (104a) of the system A, and outputs the detection signal to the switching control unit 1 (906a). The power detecting unit 2 (903b) receives input of the detection signal of the photo detector 2 (PD 2) 801b, detects the optical output (power) obtained after passing through the optical switching device 2 (104b) of the system B, and outputs the detection signal to the switching control unit 2 (906b).

The beat detecting unit 904 receives input of the detection signal of the photo detector 3 (PD 3) 801c. The input detection signal is the optical output (power) obtained after the coupling by the optical coupler 103c (see FIG. 8) of the optical outputs of the optical switching devices 1 and 2 (104a and 104b) of the systems A and B; and includes beat noise generated associated with the coupling. The beat detecting unit 904 detects beat noise having a predetermined cycle that is included in the detection signal and outputs the detection signal to the wavelength control unit 902 and the timing control unit 905.

The wavelength control unit 902 receives input of the detection signals of the wavelength detecting units 1 and 2 (901a and 901b) and the beat detecting unit 904. The wavelength control unit 902 controls the wavelength for the laser device currently under operation in the DFB laser array 102. For example, when the wavelength is fixed and when the wavelength is swept, the wavelength control unit 902 controls the temperature of the heater 401 that corresponds to the selected laser device such that the wavelength of the optical signal is the desired wavelength. The wavelength control unit 902 controls the wavelength of the selected laser devices of the systems A and B such that the beat detecting unit 904 does not detect any beat noise.

The timing control unit 905 outputs a switching timing for the systems A and B; the switching timing is based on the beat noise detected by the beat detecting unit 904. As described above, the coupling of the optical outputs of the systems A and B generates the beat noise of the predetermined cycle (generation time period) Tb. Therefore, the timing control unit 905 sets a time period Δt that is shorter than the generation time period Tb, as the switching timing of the optical output for the switching control units 1 and 2 (906a and 906b); and outputs the time period Δt thereto.

The switching control units 1 and 2 (906a and 906b) respectively instruct the driving units 1 and 2 (907a and 907b) to switch the optical output according to the time period Δt. The driving units 1 and 2 (907a and 907b) respectively cause the optical switching devices 1 and 2 (104a and 104b) to switch the optical output such that the one system is set from "transmission to blocking", the other system is set from "blocking to transmission", and the switching time period is within Δt.

The switching of the optical output of the systems A and B is executed when the wavelength is varied for over a range that exceeds the wavelength region of a single laser device of the DFB laser array 102 as described above. As to the optical output, the systems A and B are alternately sequentially and used for optical output and thereby, the band of the optical output can be varied over a wide wavelength region such as the C band, a region that exceeds the wavelength region of a single laser device in the DFB laser array 102. According to the third embodiment, beat noise that is generated when the optical output is switched between the systems A and B, is detected. Therefore, the generation of the beat noise can be suppressed and the optical output can be output continuously without discontinuing the optical output even when the band is varied over a wide range.

FIG. 10 is a flowchart of an example of control of the variation of the wavelength according to the third embodiment. In the example, the control of the switching of the optical output between the systems A and B is partially different from the example of the control of the first embodiment (see FIG. 5). In the example, the same control as that depicted in FIG. 5 is executed at steps S501 to S506.

At step S506, the control unit 107 sets the wavelength of the optical output of the selected (i+1)-th DFB (laser device) of the system B to be equal to the wavelength of the i-th DFB (laser device) of the system A using the wavelength locker 106b (step S506). At this step, because the temperature of the (i+1)-th DFB (laser device) of the system B is low immediately after the selection thereof at step S505, the control unit 107 performs control to increase the temperature of the heater 401 such that the wavelength of the (i+1)-th DFB (laser device) becomes equal to that of the i-th DFB (laser device).

The control unit 107 first sets the VOA 2 (104b) of the (i+1)-th DFB (laser device) to be in the transmission state (step S1007) and sets the VOA 1 (104a) of the i-th DFB (laser device) to be in the blocking state (step S1008). The time period after the execution of the operation at step S1007 until the completion of the execution of the operation at step S1008 is set to be "Δt". Thereby, the optical output is switched within a time period that is shorter than the predetermined cycle Tb of the beat noise generated associated with the coupling of the optical output of the systems A and B. Thereafter, the flow returns to step S502 and the operations at step S502 and thereafter are executed.

According to the control, when the optical output of the system A is transmitted, the optical switching device 2 (104b) partially transmits the optical output of the system B. At this time, the optical output (optical signal) detected by the photo detector 3 (801c) includes a small beat noise that gives substantially no influence and the beat detecting unit 904 detects this beat noise. The timing control unit 905 of the control unit 107 switches the optical output of the systems A and B between transmission and blocking, based on the timing (cycle) of the detected beat noise. In this manner, the switching timing of the optical output of the systems A and B can be controlled properly, based on the detection of the beat noise generated by the coupling of the optical output of the two systems A and B.

FIG. 11 is a flowchart of another example of the control of the variation of the wavelength according to the third embodiment. In the example, the control of the switching of the optical output between the systems A and B is partially different from the example of the control of the first embodiment (see FIG. 5). In the example, the same control as that depicted in FIG. 5 is executed at steps S501 to S506.

At step S506, the control unit 107 sets the wavelength of the optical output of the selected (i+1)-th DFB (laser device) of the system B to be equal to the wavelength of the i-th DFB (laser device) of the system A using the wavelength locker 106b (step S506). At this step, because the temperature of the (i+1)-th DFB (array) of the system B is low immediately after the selection thereof at step S505, the control unit 107 performs control to increase the temperature of the heater 401 such that the wavelength of the (i+1)-th DFB (array) is equal to that of the i-th DFB (array).

The control unit 107 first sets the VOA 1 (104a) of the i-th DFB (laser device) to be in the blocking state (step S1107) and sets the VOA 2 (104b) of the (i+1)-th DFB (laser device) to be in the transmission state (step S1108). Thereafter, the flow returns to step S502 and the operations at step S502 and thereafter are executed. According to the control, the optical output of the system B is transmitted after the optical output of the system A is blocked and therefore, no beat noise generated. After the execution of the operation at step S1107, the time period up to the completion of the execution of the operation at step S1108 is Δt.

FIG. 12 is a chart of an example where the variation of the wavelength executed by the wavelength-tunable light source is applied to wavelength defragmentation. The horizontal axes in FIG. 12 represent wavelength and the vertical axes represent the optical output (power). As depicted in (a) of FIG. 12, in the optical communication system, according to the flexible grid scheme, a change of the optical path is repeated. Thereby, unusable fragmentary spectrum bands (unused slots 1201*a* to 1201*c*) appear in the used band (such as C band). Thereby, the efficiency of use of the spectrum band drops. Each of the unused slots 1201*a* to 1201*c* has a narrow band and thus, optical communication that needs a wide bandwidth cannot be performed.

In FIG. 12, (b) of depicts the used bands after wavelength defragmentation is executed. In the wavelength defragmentation, the plural unused slots 1201*a* to 1201*c* depicted in (a) are consolidated in a predetermined wavelength region as depicted in (b) and thereby, an unused slot 1201*d* is formed that is a wide band of a predetermined bandwidth.

In this case, as depicted by (a)→(b), some of the bands 1202*a* to 1202*d* currently used for communication require the used wavelength regions to be changed. The wavelength of each of these used bands 1202*a* to 1202*d* is changed by wavelengths corresponding to one or more of the DWDM grids depicted. Accordingly, changes are necessary of wavelengths whose ranges exceed the wavelength region of a single laser device in the DFB laser array 102. Conventionally, in a case where the DFB laser array 102 is used, when the wavelength of the used bands 1202*a* to 1202*d* are changed, the communication that is using the bands 1202*a* to 1202*d* is temporarily discontinued because the operating laser devices are changed.

In contrast, according to the wavelength-tunable light source 100 of the embodiment, the wavelengths of the optical output of the systems A and B are set to be equal to each other; the system of the optical output is switched; and the wavelength is varied (swept). Thereby, variation of the wavelength over a wide range is enabled exceeding the wavelength region of a single laser device of the DFB laser array 102. According to the embodiment, the change of the wavelength over a wide wavelength range is executable for each of the used bands 1202*a* to 1202*d* as indicated by (a)→(b). The wavelength defragmentation can be executed continuing the communication service without any disruption. The continuous variation of the wavelength can be executed smoothly even when the DFB laser arrays are used, and the coherent-light communication can be continued.

According to one embodiment, the wavelength can be caused to continuously vary over a wide range without discontinuation of the optical output.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A wavelength-tunable light source comprising:
   a plurality of light sources having differing variable wavelength regions, where light sources having adjacent wavelength regions are distributed to different systems;
   a first coupling device that couples light output by the light sources included in the same system;
   an optical switching device that transmits or blocks light included in the same system;
   a second coupling device that couples light of the different systems and outputs the coupled light; and
   a control unit that controls driving of each of the light sources and the optical switching device, wherein
   the light sources are each set such that an end portion of the variable wavelength region of the light source overlaps an end portion of the variable wavelength region of another light source, and
   the control unit selects and drives a first light source among the light sources of a first system that is among the different systems, varies a wavelength of the first light source, the control unit further selects a second light source that is of a second system among the different systems and that has a wavelength region overlapping the variable wavelength region of the first light source, the control unit further drives the second light source concurrently with the first light source and subsequently switches to the output light of the second light source, causing wavelength variation and executing continuous wavelength variation over a wide range.

2. The wavelength-tunable light source according to claim 1, wherein
   the light sources constitute a distributed feedback laser array formed on a substrate,
   each laser device has a heater, and
   the control unit adjusts a temperature of the heater of a selected laser device and executes wavelength variation of the laser device.

3. The wavelength-tunable light source according to claim 1, wherein
   the end portion of the variable wavelength region of each of the light sources corresponds to at least one dense wavelength division multiplexing grid.

4. The wavelength-tunable light source according to claim 1, wherein
   the light sources have two systems of which, one system includes even-numbered wavelength regions and the other system includes odd-numbered wavelength regions among the adjacent variable wavelength regions, and
   the two systems are disposed away from each other at a predetermined distance.

5. The wavelength-tunable light source according to claim 4, wherein
   the variable wavelength regions include variable wavelength regions 1, 2, 3, . . . , N (N is an even number) sequentially numbered such that adjacent variable wavelength regions have sequential numbers, and the light sources are disposed according to variable wavelength region, in order of 1, N/2+1, 2, N/2+2, . . . , N such that a distance between the light sources having adjacent variable wavelength regions is maximized.

6. The wavelength-tunable light source according to claim 2, wherein
   the control unit adjusts a temperature of the heater of the selected laser device and thereby, executes variation of a wavelength of the laser device, and
   the control unit, when concurrently driving the first and the second light sources, adjusts the temperature of the heater of each of the laser devices having adjacent wavelength regions and thereby, performs control such that the wavelengths of the laser devices become equal to each other.

7. The wavelength-tunable light source according to claim 1, wherein
   the control unit, when concurrently driving the first and the second light sources, causes the optical switching device to reduce optical output of one system among the first and the second systems and further causes the optical switching device to increase optical output of the other system among the first and the second systems.

8. The wavelength-tunable light source according to claim 7, wherein
a variable optical attenuator is used as the optical switching device, and
the control unit, when concurrently driving the first and the second light sources, causes the variable optical attenuator of the one system to switch the optical output from a transmission state to a blocking state, and causes the variable optical attenuator of the other system to switch the optical output from the blocking state to the transmission state.

9. The wavelength-tunable light source according to claim 7, wherein
a semiconductor optical amplifier is used as the optical switching device, and
the control unit, when concurrently driving the first and the second light sources, causes a state of the semiconductor optical amplifier of the one system to switch to a state where gain of the optical output is reduced, and causes a state of the variable optical attenuator of the other system to switch to a state where the optical output is increased.

10. The wavelength-tunable light source according to claim 7, wherein
the optical switching device, when the first and the second light sources are concurrently driven, switches the optical output of the first and the second systems within a time period that is shorter than a generation time period of beat noise that is generated by coupling of the optical output of the first and the second systems.

11. The wavelength-tunable light source according to claim 1, further comprising
a photo detector that detects an optical signal obtained after the second coupling device couples the optical output of the different systems, wherein
the control unit, when concurrently driving the first and the second light sources, detects for beat noise included in the optical signal detected by the photo detector and causes the optical switching device to switch the optical output of the first and the second systems within a time period that is shorter than a generation time period of the beat noise.

12. A wavelength variation method of a wavelength-tunable light source that includes a plurality of light sources having differing variable wavelength regions, where light sources having adjacent wavelength regions are distributed to different systems; a first coupling device that couples light output by the light sources included in the same system; an optical switching device that transmits or blocks light included in the same system; a second coupling device that couples light of the different systems and outputs the coupled light; and a control unit that controls driving of each of the light sources and the optical switching device, the wavelength variation method comprising:
setting each of the light sources such that an end portion of the variable wavelength region of the light source overlaps an end portion of the variable wavelength region of another light source;
selecting and driving a first light source among the light sources of a first system that is among the different systems, and varying a wavelength of the first light source, the selecting, the driving and the varying being executed by the control unit;
selecting a second light source that is of a second system among the different systems and that has a wavelength region overlapping the variable wavelength region of the first light source, and driving the second light source concurrently with the first light source, the selecting and the driving being performed by the control unit; and
switching to the output light of the second light source, causing wavelength variation to execute continuous wavelength variation over a wide range.

* * * * *